United States Patent
Ooya et al.

(10) Patent No.: US 7,323,937 B2
(45) Date of Patent: Jan. 29, 2008

(54) VARIABLE-GAIN AMPLIFIER

(75) Inventors: Koichi Ooya, Kanagawa (JP); Tsuyoshi Sakuma, Tokyo (JP)

(73) Assignee: Sony Corporation (JP)

( * ) Notice: Subject to any disclaimer, the term of this patent is extended or adjusted under 35 U.S.C. 154(b) by 158 days.

(21) Appl. No.: 10/526,758

(22) PCT Filed: Sep. 10, 2003

(86) PCT No.: PCT/JP03/11572

§ 371 (c)(1),
(2), (4) Date: Aug. 3, 2005

(87) PCT Pub. No.: WO2004/027988

PCT Pub. Date: Apr. 1, 2004

(65) Prior Publication Data

US 2006/0033575 A1 Feb. 16, 2006

(30) Foreign Application Priority Data

Sep. 18, 2002 (JP) .............................. 2002-271707

(51) Int. Cl.
*H03F 3/68* (2006.01)
(52) U.S. Cl. ...................... 330/295; 330/279; 330/285
(58) Field of Classification Search ................ 330/285, 330/295, 278–279
See application file for complete search history.

(56) References Cited

U.S. PATENT DOCUMENTS 6,028,487 A * 2/2000 Kakuta et al. .............. 330/311
6,400,227 B1 * 6/2002 Goldfarb et al. ............ 330/295
6,472,940 B1 * 10/2002 Behzad et al. .............. 330/279
6,744,322 B1 * 6/2004 Ma et al. .................... 330/300
6,888,411 B2 * 5/2005 Behzad et al. .............. 330/311

FOREIGN PATENT DOCUMENTS

| JP | 48-90653 A | 11/1973 |
| JP | 53-060546 A | 5/1978 |
| JP | 55-51030 U | 4/1980 |
| JP | 02-308606 A | 12/1990 |
| JP | 04-087406 A | 3/1992 |
| JP | 06-334454 A | 12/1994 |
| JP | 11-234067 A | 8/1999 |
| JP | 2001-223549 A | 8/2001 |
| JP | 2002-176371 A | 6/2002 |

* cited by examiner

*Primary Examiner*—Robert Pascal
*Assistant Examiner*—Hieu Nguyen
(74) *Attorney, Agent, or Firm*—Lerner, David, Littenberg, Krumholz & Mentlik, LLP

(57) ABSTRACT

A variable-gain amplifier has distortion characteristics (IIP3) improved when the gain is attenuated without impairing characteristics with respect to a gain PG and a noise figure NF when the gain is maximum. The variable-gain amplifier has a plurality of parallel-connected dual-gate FETs having first FETs (6), (8) having gates for being supplied with an input signal and second FETs (7), (9) connected in cascade to the first FETs (6), (8), respectively. Gate control voltages (Vcon1, Vcon2) can separately be applied to the second FETs (7), (9), respectively, from voltage control means.

7 Claims, 6 Drawing Sheets

VARIABLE-GAIN AMPLIFIER

CROSS REFERENCE TO RELATED APPLICATIONS

This application is a 371 of PCT/JP03/11572 filed Sep. 10, 2003, which claims priority of Japanese Patent Application No. 2002-271707 filed on Sep. 18, 2002, the disclosures of which are hereby incorporated by reference herein.

TECHNICAL FIELD

The present invention relates to a variable-gain amplifier for use in the tuner of a cable modem, and more particularly to a variable-gain amplifier capable of improving distortion characteristics (IIP3) when the gain is attenuated.

BACKGROUND ART

To meet growing demands in recent years for broadband Internet-connected devices, there have been provided various cable modems that can be connected to the Internet via CATV. It has been desirable to reduce the size of cable modem devices as with other electronic devices. For reducing the size of cable modem devices, tuners for use in the cable modem devices need to be reduced in size of necessity. Though there were limitations on efforts to reduce the size of such tuners because they were made up of discrete parts, it has been made possible in recent years to greatly reduce the size of tuners because of the advanced circuit integration technology.

Most tuner ICs for use in the cable modem applications employ a double superheterodyne reception configuration. FIG. 8 of the accompanying drawings is a block diagram of a tuner of double superheterodyne reception. In FIG. 8, the tuner has an antenna 101, a variable-gain amplifier 102 for amplifying a CATV signal, a first voltage-controlled oscillator 103 for locally oscillating at a frequency depending on a control voltage applied thereto, a first frequency mixer 104 for multiplying the CATV signal output from the variable-gain amplifier 102 and the output signal from first voltage-controlled oscillator 103 for frequency conversion to output a first intermediate-frequency signal having a frequency corresponding to the difference between the multiplied signals, a bandpass filter 105 for passing a signal in a given frequency band only to extract an intermediate-frequency signal in a desired channel thereby to select a station, a second voltage-controlled oscillator 106 for locally oscillating at a frequency depending on a control voltage applied thereto, a second frequency mixer 107 for multiplying the first intermediate-frequency signal output from the bandpass filter 105 and the output signal from the second voltage-controlled oscillator 106 for frequency conversion to output a second intermediate-frequency signal having a frequency corresponding to the difference between the multiplied signals, and an intermediate-frequency signal amplifier 108 for amplifying the second intermediate-frequency signal output from the second frequency mixer 107 and outputting the amplified second intermediate-frequency signal as a tuner output signal.

Operation and characteristics of the tuner will briefly be described below.

A CATV signal having a frequency of 100 MHz, for example, which is input from the antenna 101, is amplified by the variable-gain amplifier 102, and sent to the first frequency mixer 104. The first frequency mixer 104 is supplied with the CATV signal and a local oscillation signal having a frequency of 1300 MHz, for example, output from the first voltage-controlled oscillator 103, and performs frequency conversion to output a first intermediate-frequency signal having a frequency of 1200 MHz. The bandpass filter 105 passes a signal having a frequency near 1200 MHz to extract a first intermediate-frequency signal in a desired channel. The second frequency mixer 107 is supplied with the first intermediate-frequency signal having the frequency of 1200 MHz and a local oscillation signal having a frequency of 1156 MHz, for example, output from the second voltage-controlled oscillator 106, and performs frequency conversion to output a second intermediate-frequency signal having a frequency of 44 MHz. The intermediate-frequency signal amplifier 108 amplifies the second intermediate-frequency signal supplied thereto and outputs the amplified second intermediate-frequency signal as a tuner output signal. The above frequencies of the CATV signal, the first intermediate-frequency signal, the second intermediate-frequency signal, etc. are given as an example of frequencies that are actually employed in a CATV system tuner.

The tuner that performs the above frequency conversion has an input signal level ranging from −70 to +30 dBm. Since signals of a maximum of 130 waves are input to the tuner, the variable-gain amplifier 102 at the first stage is required to have a gain of 10 dB, a noise figure of 6 dB, a maximum attenuation level of 40 dB, a third-order Input Intercept Point (hereinafter referred to as "IIP3") of +15 dBm at a maximum gain, and an IIP3 of +30 dBm at an attenuated gain (−15 dB). Therefore, as the gain is lower, stricter distortion requirements are imposed on the variable-gain amplifier 102.

The variable-gain amplifier with such distortion requirements placed thereon includes bipolar transistors and dual-gate field-effect transistors (hereinafter referred to as "dual-gate FETs"). Operation of a dual-gate FET will be described below. FIG. 9 is a circuit diagram of a variable-gain amplifier including a dual-gate FET. In FIG. 9, the variable-gain amplifier has a first FET 111, a second FET 112 connected in cascade to the first FET 111, a voltage source 113, a ground level 114, a signal input terminal 115, a resistor 116 connected to the gate G1 of the first FET 111 for applying a suitable bias voltage to an input signal, a voltage source 117 for applying a suitable bias voltage, a variable voltage source 118 connected to the gate G2 of the second FET 112, a load resistor 119 for extracting an output signal, and a signal output terminal 120. The voltage source 117 may be provided by dividing the voltage from the voltage source 113 with resistors.

In the dual-gate FET of the above construction, an input signal is applied to the gate G1 of the first FET 111, and an output signal is produced from the drain of the second FET 112. The gain of the variable-gain amplifier is controlled by changing the voltage applied to the gate T2 of the second FET 112. For example, when the voltage applied to the gate G2 of the second FET 112 is lowered, the source voltage of the second FET 112 is lowered, reducing a drain-to-source voltage Vds of the first FET 111. As the drain-to-source voltage Vds becomes lower, the mutual conductance gm of the first FET 111 becomes smaller, resulting in a reduction in the gain. Conversely, when the voltage applied to the gate G2 of the second FET 112 is increased, the gain is increased. The variable-gain amplifier operates in the same manner as described above even if the gain-control FET 112 is replaced with an NPN transistor. A variable-gain amplifier including a dual-gate FET is disclosed in Japanese Patent Laid-open No. 2002-176371 (Paragraph 0010, FIG. 1).

Characteristics about gain, noise, etc. of the variable-gain amplifier including the dual-gate FET shown in FIG. 9 will be described below. FIG. 10 of the accompanying drawings is a plan view showing a general arrangement of an FET formed on an integrated circuit (IC). In FIG. 10, Lg represents a gate length, and Wg a gate width. FIG. 11 of the accompanying drawings is a graph showing the relationship between the gate width, the gain, and the noise figure. In FIG. 11, PG represents the gain, and NF the noise figure. FIG. 12 of the accompanying drawings is a graph showing the relationship between the gain attenuation and the IIP3. In FIG. 12, the gain attenuation and the IIP3are related in different patterns depending on the gate width used as a parameter. As can be seen from FIGS. 11 and 12, as the gate width Wg increases, the gain PG increases and the noise figure NF decreases, increasing noise characteristics. However, distortion characteristics given as the IIP3are lowered. In order to fulfill the requirements for the PG and NF characteristics when the gain is maximum, it is necessary to use FETs with Wg=20 (μm), which however fail to fulfill the requirements for the characteristics of the IIP3when the gain is attenuated. In order to fulfill the requirements for the characteristics of the IIP3when the gain is attenuated, it is necessary to use FETs with Wg=5 (μm), which lower the PG and NF characteristics. This means that there is a trade-off between efforts to increase the PG and NF characteristics and efforts to increase the IIP3characteristics, and it is difficult to obtain a variable-gain amplifier satisfying both the requirements for the PG and NF characteristics and the requirements for the IIP3characteristics.

The present invention has been made in order to solve the above problems. It is an object of the present invention to provide a variable-gain amplifier capable of improving the distortion characteristics IIP3when the gain is attenuated, without lowering the characteristics with respect to the gain PG and the noise figure NF when the gain is maximum.

DISCLOSURE OF INVENTION

A variable-gain amplifier according to the present invention includes a plurality of dual-gate FETs having first FETs having respective gates for being supplied with an input signal and second FETs having respective sources connected respectively to drains of the first FETs, the first FETs having respective sources connected in common to each other and the second FETs having respective drains connected in common to each other, and a plurality of voltage control means connected to respective gates of the second FETs for applying gate voltages separately thereto.

A variable-gain amplifier according to the present invention includes a plurality of variable-gain amplifying elements having FETs having respective gates for being supplied with an input signal and bipolar transistors having respective emitters connected respectively to drains of the FETs, the FETs having respective sources connected in common to each other and the bipolar transistors having respective collectors connected in common to each other, and a plurality of voltage control means connected to respective bases of the bipolar transistors for applying base voltages separately thereto.

In the variable-gain amplifier according to the present invention, the FETs for being supplied with the input signal have substantially identical electric characteristics.

In the variable-gain amplifier according to the present invention, at least one of the FETs for being supplied with the input signal has electric characteristics different from electric characteristics of the other one or more of the FETs for being supplied with the input signal.

The variable-gain amplifier according to the present invention has a voltage feedback path interconnecting a signal input section and a signal output section.

A variable-gain amplifier according to the present invention includes a plurality of first dual-gate FETs having first FETs having respective gates for being supplied with an input signal and second FETs having respective sources connected respectively to drains of the first FETs, the first FETs having respective sources connected in common to each other and the second FETs having respective drains connected in common to each other, a plurality of second dual-gate FETs having third FETs having respective gates for being supplied with an inverted input signal and fourth FETs having respective sources connected respectively to drains of the third FETs, the third FETs having respective sources connected in common to each other and the fourth FETs having respective drains connected in common to each other, and a plurality of voltage control means connected to respective gates of the second FETs and respective gates of the fourth FETs for applying gate voltages separately thereto. The number of the first dual-gate FETs, the number of the second dual-gate FETs, and the number of the voltage control means are equal to each other.

BEST MODE FOR CARRYING OUT THE INVENTION

Embodiments of the present invention will be described below with reference to the accompanying drawings. In order to clarify the correspondence between the elements of the described embodiments and the elements of the claimed invention, the elements of the claimed invention corresponding to the elements of the described embodiments will be placed in parentheses following the elements of the described embodiments in the following description of the embodiments of the present invention.

First Embodiment

Figure 1:
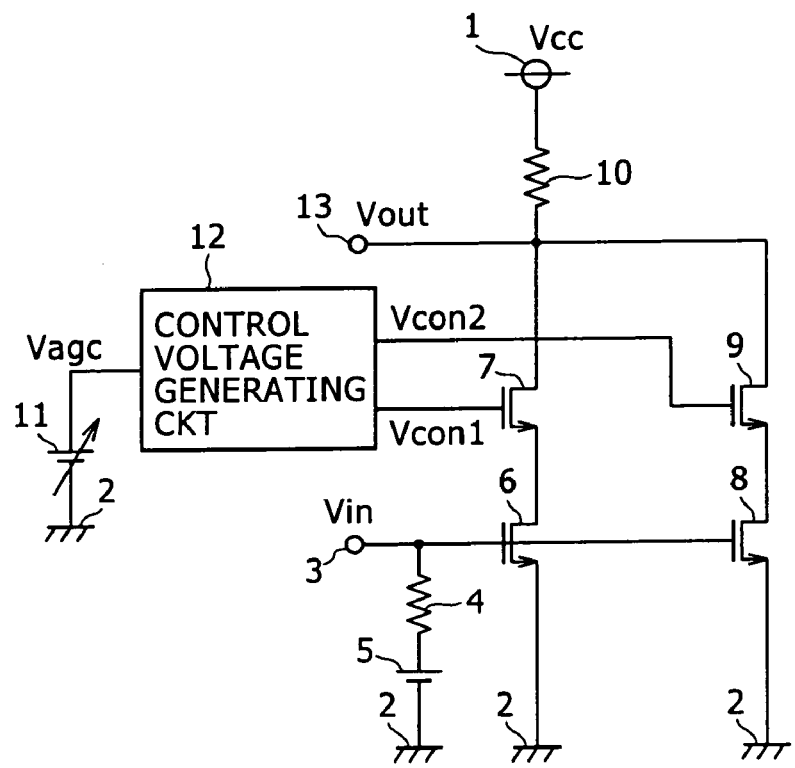
FIG. 1 is a circuit diagram showing an arrangement of a variable-gain amplifier according to a first embodiment of the present invention.

FIG. 1 is a circuit diagram showing an arrangement of a variable-gain amplifier according to a first embodiment of the present invention. In FIG. 1, the variable-gain amplifier has a voltage source 1, a ground level 2, a signal input terminal (signal input section) 3, a resistor 4 connected to the signal input terminal 3 for applying a suitable bias voltage to an input signal, a voltage source 5 for applying a suitable bias voltage, an FET (first FET) 6 having a gate connected to the signal input terminal 3 and a source connected to the ground level 2, an FET (second FET) 7 having a source connected to the drain of the FET 6, an FET (first FET) 8 having a gate connected to the signal input terminal 3 and a source connected to the ground level 2, an FET (second FET) 9 having a source connected to the drain of the FET 8, a load resistor 10 having an end connected in common to the drain of the FET 7 and the drain of the FET 9 and the other end to the voltage source 1, for extracting an output signal, a variable voltage source 11, a control voltage generating circuit 12 connected to the gate of the FET 7, the gate of the FET 9, and the variable voltage source 11 for independently controlling a voltage to be applied to the gate of the FET 7 and a voltage to be applied to the gate of the FET 9, and a signal output terminal (signal output section) 13 connected to the drain of the FET 7 and the drain of the FET 9. The variable voltage source 11 and the control voltage generating circuit 12 jointly makeup a first voltage control means for controlling the voltage to be applied to the gate of the FET 7. The variable voltage source 11 and the control voltage generating circuit 12 also jointly makeup a second voltage control means for controlling the voltage to be applied to the gate of the FET 9 independently of the first voltage control means. In the present embodiment, the gate width of the FET 6 and the gate width of the FET 8 are equally of 10 (μm).

Operation of the variable-gain amplifier will be described below.

Figure 12:
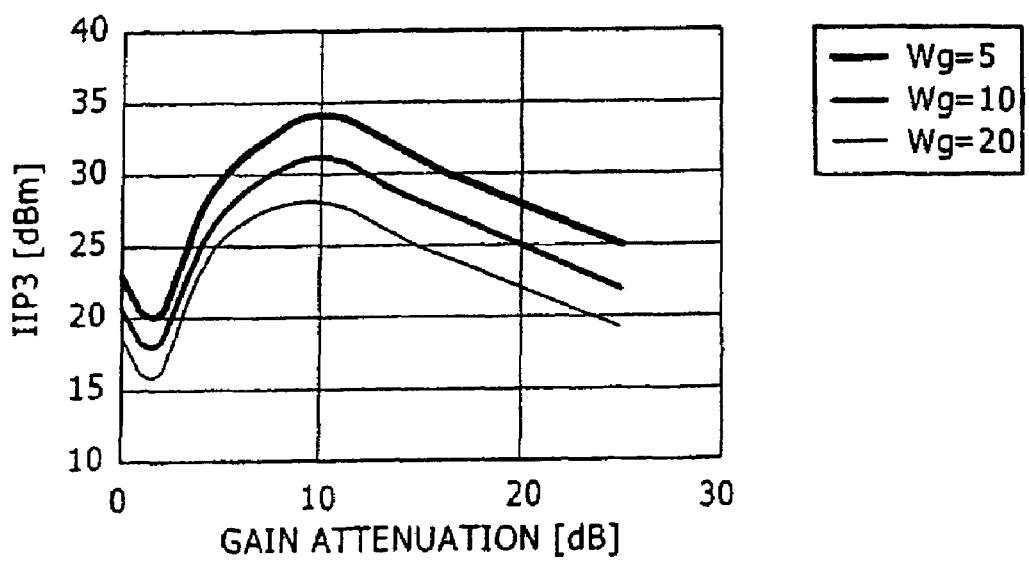
FIG. 12 is a diagram showing the relationship between the gain attenuation and the IIP3.

It is assumed that the voltage of the variable voltage source 11 is represented by Vagc, the gate control voltage applied to the gate of the FET 7 by Vcon1, and the gate control voltage applied to the gate of the FET 9 by Vcon2. First, a process of controlling the gate of the variable-gain amplifier shown in FIG. 1 with the gate control voltage Vcon1 and the gate control voltage Vcon2 being equal to each other will be described below. If FETs having the same electric characteristics are connected parallel to each other, then they have the same electric characteristics as those of an FET having a gate width that is twice as big. Therefore, when the FETs are controlled by the same voltage, the IIP3characteristics indicated by the curve Wg=20 (μm) shown in FIG. 12 are provided. The PG characteristics and the NF characteristics are also substantially the same, as a whole, as those characteristics given when Wg=20 (μm). Therefore, PG=10 dB, NF=6 dB, IIP3=19 dBm (when the gain is maximum), and IIP3=25 dBm (when the gain is attenuated by 15 dB).

Figure 2:
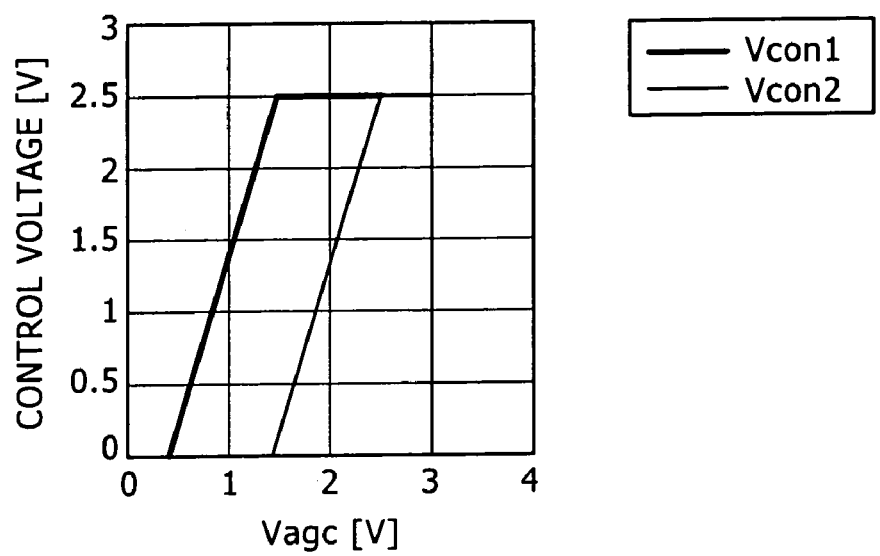
FIG. 2 is a diagram illustrative of a process of controlling gate control voltages.
Figure 3:
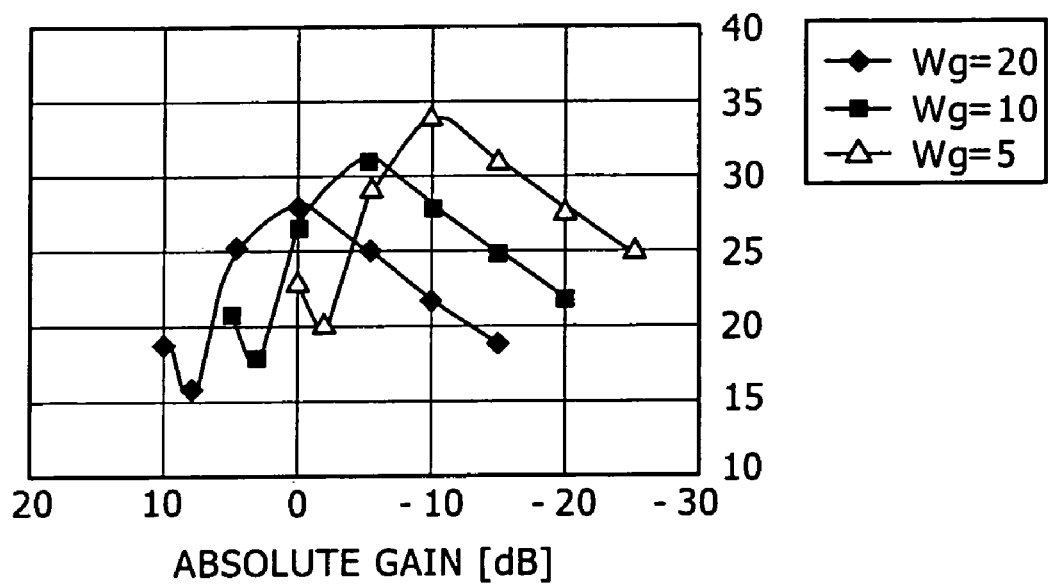
FIG. 3 is a diagram showing the relationship between the absolute gain and the IIP3.

A process of controlling the gate of the variable-gain amplifier with the gate control voltage Vcon1 and the gate control voltage Vcon2 being independently (separately) controlled will be described below. FIG. 2 is a diagram illustrative of a process of controlling gate control voltages, and FIG. 3 is a diagram showing the relationship between the absolute gain and the IIP3. FIG. 3 is given as a modification of the graph shown in FIG. 12 by changing the variable represented by the horizontal axis for the IIP3characteristics from the gain attenuation to the absolute gain. When the gate control voltage Vcon1 and the gate control voltage Vcon2 are controlled as shown in FIG. 2, since a maximum gate voltage is applied to the gates of the FET 7 and the FET 9 when the gain is maximum, the characteristics that are substantially the same as the characteristics given when Wg=20 (μm) are obtained as a whole. Therefore, PG=10 dB, NF=6 dB, and IIP3=19 dBm. When the gain is attenuated by 15 dB, Vcon2=0, i.e., the gate voltage applied to the gate of the FET 9 is nil, turning off a dual-gate FET made up of the FET 8 and the FET 9. With respect to the IIP3characteristics, an IIIP3value of 31 dBm corresponding to the absolute gain of −5 dB on the curve Wg=10 (μm) in FIG. 3 is obtained. That is, the PG characteristics and the NF characteristics when the gain is maximum are obtained as characteristics given when Wg=20 (μm), and the IIP3characteristics when the gain is attenuated are obtained as characteristics given when Wg=10 (μm).

According to the first embodiment, as described above, the variable-gain amplifier has a dual-gate FET including the FET 6 for being supplied with an input signal and the FET 7 connected in cascade to the FET 6, a dual-gate FET including the FET 8 for being supplied with an input signal and the FET 9 connected in cascade to the FET 8, a first voltage control means for controlling the gate control voltage Vcon1 applied to the gate of the FET 7, and a second voltage control means for controlling the gate control voltage Vcon2 applied to the gate of the FET 9 independently of the first voltage control means, the FET 6 and the FET 8 having respective sources connected in common to each other and the FET 7 and the FET 9 having respective drains connected in common to each other for extracting an output signal. Consequently, when the gate control voltage Vcon1 and the gate control voltage Vcon2 are appropriately controlled by the first voltage control means and the second voltage control means, the requirements for the PG characteristics and the NF characteristics when the gain is maximum are fulfilled, and the requirements for the IIP3characteristics when the gain is attenuated are fulfilled.

In the first embodiment, the number of dual-gate FETs connected parallel to each other is 2. However, three or more dual-gate FETs may be connected parallel to each other to provide a variable-gain amplifier as a whole. According to such a modification, in each of the dual-gate FETs, the voltage control means connected to the respective gates of the FETs serving as the second FET, as with the FET 7 and the FET 9 described above, are separately controlled to apply gate control voltages in an appropriate combination for improving the characteristics of the variable-gain amplifier.

Figure 4:
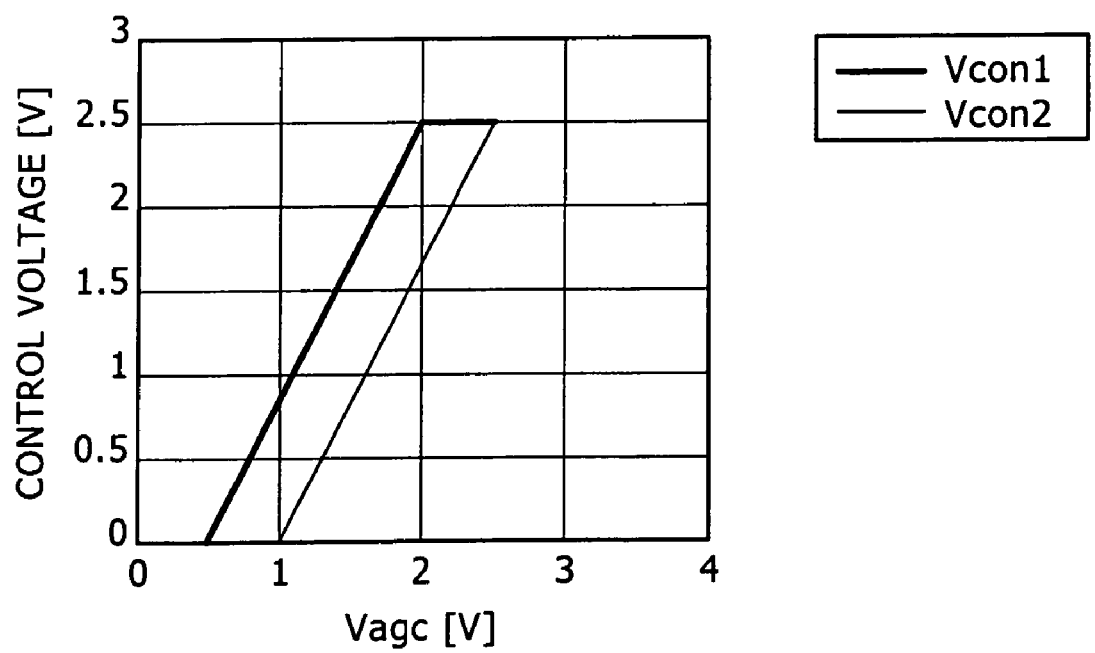
FIG. 4 is a diagram illustrative of another process of controlling gate control voltages.

In the first embodiment, as shown in FIG. 2, the gate control voltage Vcon1 and the gate control voltage Vcon2 are controlled in separate voltage changing ranges. Specifically, after the gate control voltage Vcon1 reaches a maximum value, the gate control voltage Vcon2 is increased, or after the gate control voltage Vcon2 becomes nil, the gate control voltage Vcon1 is reduced. However, the gate control process for the variable-gain amplifier according to the present invention is not limited to the above process. Rather, the gate control voltage Vcon1 and the gate control voltage Vcon2 may be controlled in overlapping voltage changing ranges. FIG. 4 illustrates another process of controlling gate control voltages. In FIG. 4, a certain delay is provided between changes in the gate control voltage Vcon1 and changes in the gate control voltage Vcon2 for improving the distortion characteristics IIP3when the gain is attenuated without impairing the characteristics with respect to the gain PG and the noise factor NF when the gain is maximum, as with the first embodiment. The above overlapping voltage changing ranges allow the voltage Vagc of the variable voltage source 11 and the gain attenuation to be linearly related to each other to a certain extent for making it easy to control the gain and also reducing IIP3degradations when the gain is attenuated by about 2 dB.

In the first embodiment, the FET 6 and the FET 8 have the same electric characteristics due to the same gate length and the same gate width. However, the FET 6 and the FET 8 may have different electric characteristics. For example, the gate length Lg and the gate width Wg may be changed to construct the FET 6 and the FET 8 in different configurations for further improving the IIP3when the gain is attenuated. Furthermore, though the first voltage control means for controlling the gate control voltage Vcon1 and the second voltage control means for controlling the gate control voltage Vcon2 are independently operable in the first embodiment, these voltage control means may be made dependent on each other to some degree insofar as the above operation and advantages are achieved. The voltage control means that are made dependent on each other make it possible to reduce control parameters for a simplified overall arrangement.

A modification of the first embodiment will be described below.

Figure 5:
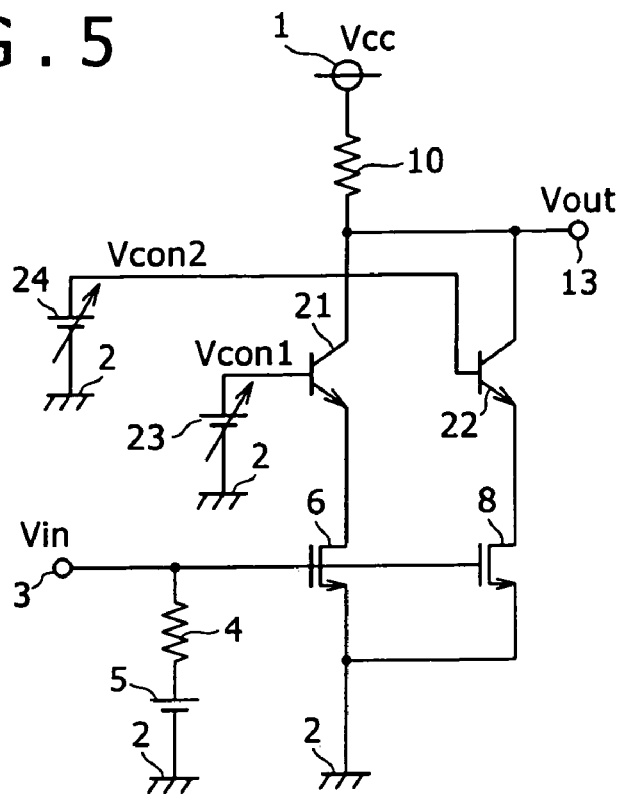
FIG. 5 is a circuit diagram showing an arrangement of a variable-gain amplifier according to a modification of the first embodiment of the present invention.

FIG. 5 is a circuit diagram showing an arrangement of a variable-gain amplifier according to a modification of the first embodiment of the present invention. Those reference characters in FIG. 5, which are identical to those in FIG. 1, denote identical or corresponding parts, and will not be described below. The variable-gain amplifier has an NPN transistor (bipolar transistor) 21 having an emitter connected to the drain of the FET 6, an NPN transistor (bipolar transistor) 22 having an emitter connected to the drain of the FET 8, a variable voltage source (voltage control means) 23 connected to the base of the NPN transistor 21 for controlling a voltage Vcon1 to be applied to the base thereof, and a variable voltage source (voltage control means) 24 connected to the base of the NPN transistor 22 for controlling a voltage Vcon2 to be applied to the base thereof. As with the variable-gain amplifier shown in FIG. 1, the NPN transistor 21 and the NPN transistor 22 have respective collectors connected in common to each other. The FET 6 and the NPN transistor 21 which are connected in cascade, and the FET 8 and the NPN transistor 22 which are connected in cascade make up respective variable-gain amplifying elements as claimed. The variable-gain amplifying elements correspond to the dual-gate FETs in the variable-gain amplifier shown in FIG. 1. Operation of the variable-gain amplifier shown in FIG. 5 is the same as operation of the variable-gain amplifier shown in FIG. 1 and will not be described below. Since the bipolar transistors are connected in cascade to the FETs for being supplied with an input signal, the impedances of the FETs as seen from the drains thereof are reduced, and hence variations caused in a drain-to-source voltage Vds of the FETs by an AC signal are reduced, the distortion characteristics of the output signal are improved.

Second Embodiment

Figure 6:
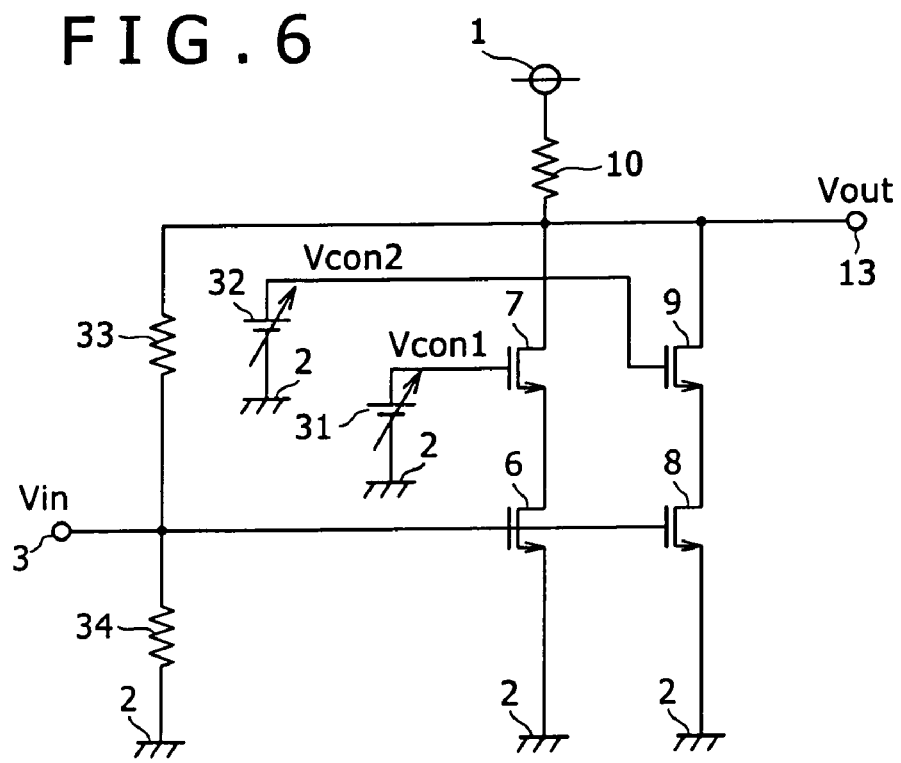
FIG. 6 is a circuit diagram showing an arrangement of a variable-gain amplifier according to a second embodiment of the present invention.

FIG. 6 is a circuit diagram showing an arrangement of a variable-gain amplifier according to a second embodiment of the present invention. Those reference characters in FIG. 6, which are identical to those in FIG. 1, denote identical or corresponding parts,.and will not be described below. The variable-gain amplifier has a variable voltage source (voltage control means) 31 connected to the gate of the FET 7 for controlling a voltage Vcon1 to be applied to the gate thereof, a variable voltage source (voltage control means) 32 connected to the gate of the FET 9 for controlling a voltage Vcon2 to be applied to the gate thereof, a resistor 33 interposed between the signal output terminal 13 and the signal input terminal 3, and a resistor 34 interposed between the signal input terminal 3 and the ground level 2. A voltage feedback path is thus connected between the signal output terminal 13 and the signal input terminal 3 through the resistor 33 for applying a voltage-feedback gate bias thereby to suppress changes caused in the drain current by production tolerances of the FETs for stabilized circuit operation.

Third Embodiment

Figure 7:
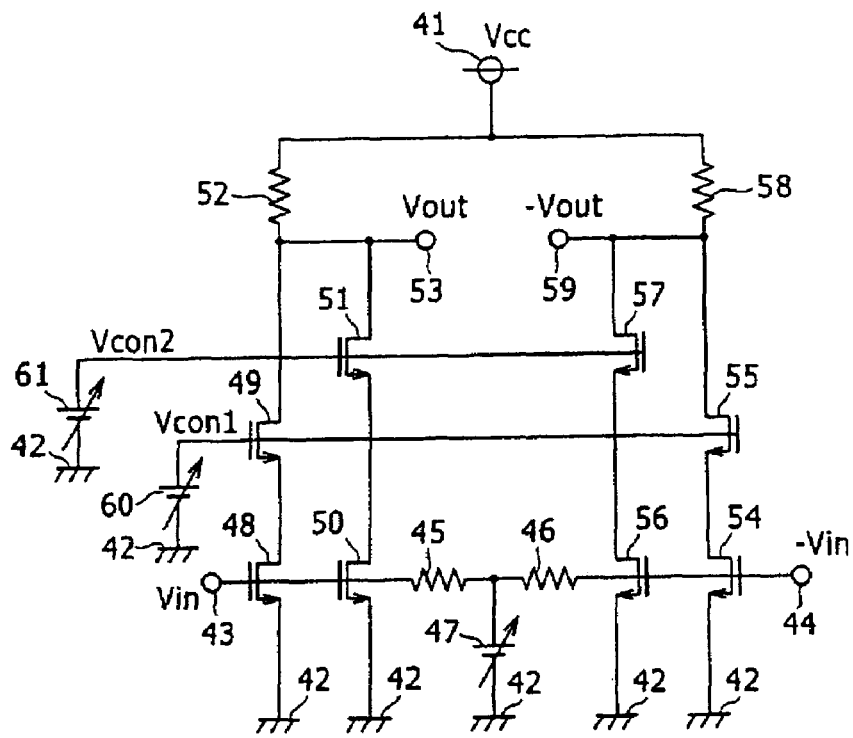
FIG. 7 is a circuit diagram showing an arrangement of a variable-gain amplifier according to a third embodiment of the present invention.
Figure 8:
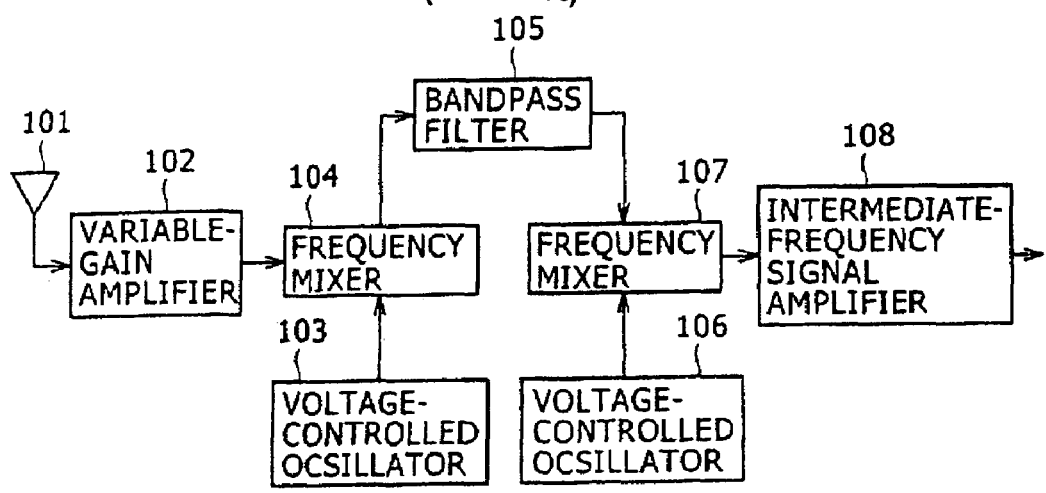
FIG. 8 is a block diagram of a tuner of double superheterodyne reception.
Figure 9:
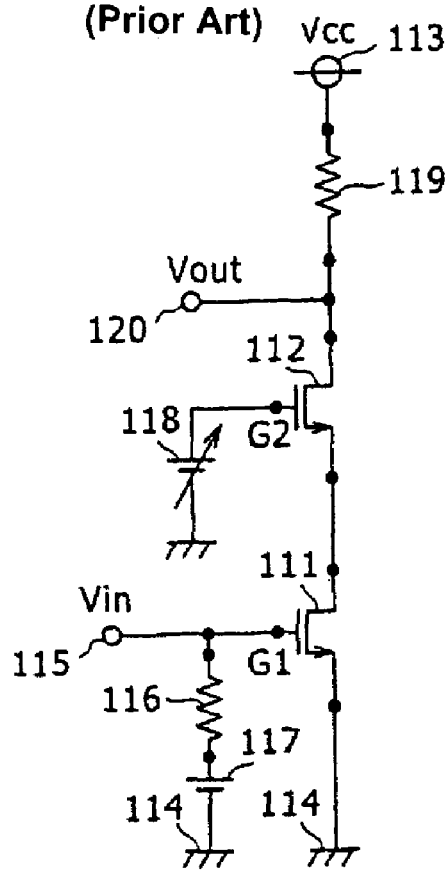
FIG. 9 is a circuit diagram showing an arrangement of a variable-gain amplifier employing a dual-gate FET.
Figure 10:
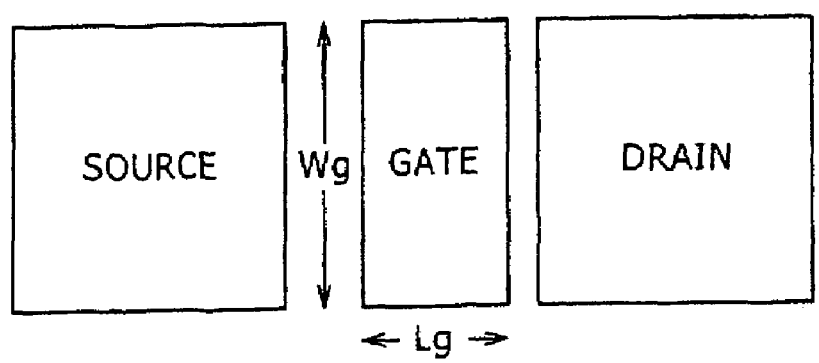
FIG. 10 is a plan view showing a general arrangement of an FET formed on an integrated circuit.
Figure 11:
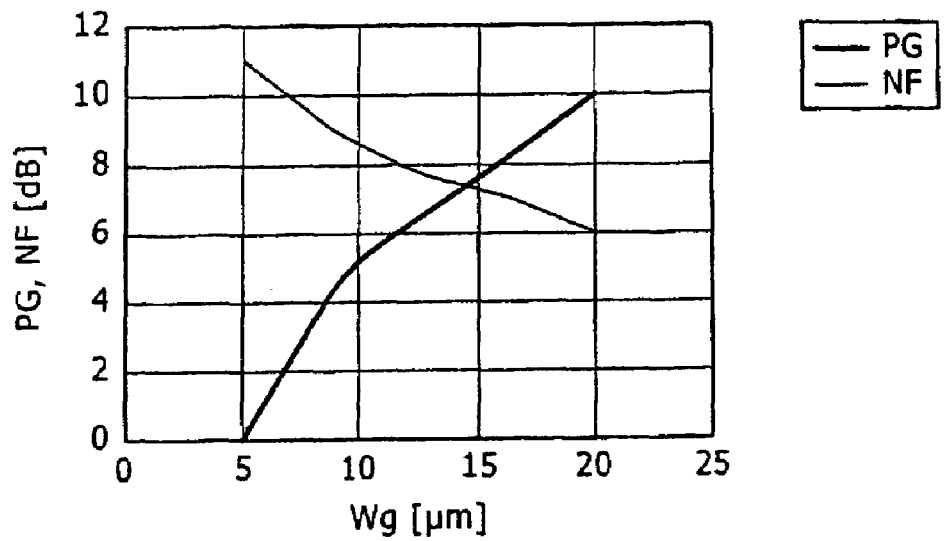
FIG. 11 is a diagram showing the relationship between the gate width, the gain, and the noise figure.

FIG. 7 is a circuit diagram showing an arrangement of a variable-gain amplifier according to a third embodiment of the present invention. In FIG. 7, the variable-gain amplifier has a voltage source 41, a ground level 42, a first signal input terminal 43, a second signal input terminal 44 for inputting an inverted signal which is an inversion of a signal input to the first signal input terminal 43, a resistor 45 connected to the first signal input terminal 43 for applying an appropriate bias voltage to the input signal, a resistor 46 connected to the second signal input terminal 44 for applying an appropriate bias voltage to the inverted input signal, a voltage source 47 connected to the resistor 45 and the resistor 46 for applying an appropriate bias voltage, an FET (first FET) 48 having a gate connected to the first signal input terminal 43 and a source connected to the ground level 42, an FET (second FET) 49 having a source connected to the drain of the FET 48, an FET (first FET) 50 having a gate connected to the first signal input terminal 43 and a source connected to the ground level 42, an FET (second FET) 51 having a source connected to the drain of the FET 50, a load resistor 52 having an end connected in common to the drain of the FET 49 and the drain of the FET 51 and the other end to the voltage source 41, for extracting an output signal, a signal output terminal 53 connected to the drain of the FET 49 and the drain of the FET 51, an FET (third FET) 54 having a gate connected to the second signal input terminal 44 and a source connected to the ground level 42, an FET (fourth FET) 55 having a source connected to the drain of the FET 54, an FET (third FET) 56 having a gate connected to the second signal input terminal 44 and a source connected to the ground level 42, an FET (fourth FET) 57 having a source connected to the drain of the FET 56, a load resistor 58 having an end connected in common to the drain of the FET 55 and the drain of the FET 57 and the other end to the voltage source 41, for extracting an inverted output signal, a signal output terminal 59 connected to the drain of the FET 55 and the drain of the FET 57, a first variable voltage source (voltage control means) 60 connected to the gate of the FET 49 and the gate of the FET 55 for controlling a voltage Vcon1 to be applied to the gates thereof, and a second variable voltage source (voltage control means) 61 connected to the gate of the FET 51 and the gate of the FET 57 for controlling a voltage Vcon2 to be applied to the gates thereof.

The first FET as the FET 48 and the second FET as the FET 49 connected in cascade to the FET 48 jointly make up a first dual-gate FET serving as a variable-gate amplifying element for amplifying an input signal. The third FET as the FET 54 and the fourth FET as the FET 55 connected in cascade to the FET 54 jointly make up a second dual-gate FET serving as a variable-gate amplifying element for amplifying an inverted input signal. As can be seen from the circuit diagram shown in FIG. 7, the number of first dual-gate FETs and the number of second dual-gate FETs are the same as each other for providing balance between the input and output signals. The voltage control means as the variable voltage sources 60, 61 are provided as many as the number of first and second dual-gate FETs, and apply the same gate voltage to the second FET and the fourth FET which are associated with each other as the FET 49 and the FET 55, for example. For providing balance between the input and output signals, the FET 48, the FET 50, the FET 54, and the FET 56 whose gates are supplied with the input signal have substantially the same electric characteristics, and the FET 49, the FET 51, the FET 55, and the FET 57 whose gates are supplied with control voltages also have substantially the same electric characteristics.

With the above arrangement, the variable-gain amplifier made up of the FETs 48, 49, 50, 51 and the variable voltage sources 60, 61 for amplifying the input signal, and the variable-gain amplifier made up of the FETs 54, 55, 56, 57 and the variable voltage sources 60, 61 for amplifying the inverted input signal can provide the same gate in a gain control range. Therefore, balanced signals can be input to and output from the variable-gain amplifiers for improving second-order distortions and canceling common mode noise.

The variable-gain amplifiers according to the first through third embodiments described above do not limit the present invention, but are illustrative only. The technical scope of the present invention is determined by the scope of claims, and various design changes may be made within the technical scope defined by the claims. For example, though NMOS transistors are employed as FETs in the above embodiments, PMOS transistors may also be employed as FETs for the same advantages as described above.

According to the present invention, as described above, since a plurality of dual-gate FETs each including a first FET having a gate for being supplied with an input signal and a second FET connected in cascade to the first FET are connected parallel to each other, and voltages can separately be applied to the second FETs from corresponding voltage control means, the distortion characteristics IIP3can be improved when the gain is attenuated without impairing the gain and the noise figure when the gain is maximum, by appropriately controlling the gate control voltages applied by the respective voltage control means.

According to the present invention, since a plurality of variable-gain amplifying elements each including an FET having a gate for being supplied with an input signal and a bipolar transistor connected in cascade to the FET are connected parallel to each other, and voltages can separately be applied to the bipolar transistors from corresponding voltage control means, the distortion characteristics IIP3can be improved when the gain is attenuated without impairing the gain and the noise figure when the gain is maximum, by appropriately controlling the base control voltages applied by the respective voltage control means. As the bipolar transistor is connected in cascade to the FET for being supplied with the input signal, the impedance of the FET as seen from the drain thereof is reduced, and hence variations caused in a drain-to-source voltage Vds of the FET by an AC signal are reduced, so that the distortion characteristics of the output signal are improved.

According to the present invention, since the FETs for being supplied with the input signal have substantially the same electric characteristics, the characteristics with respect to the PG, the NF, and the IIP3of the dual-gate FETs change identically with respect to changes in the voltages output from the voltage control means. Because circuit characteristics according to various combinations of the control voltages output from the voltage control means can easily be identified, the variable gain control can easily be performed.

According to the present invention, since at least one of the FETs for being supplied with the input signal has electric characteristics different from electric characteristics of the other one or more of the FETs for being supplied with the input signal. Therefore, the distortion characteristics IIP3can further be improved when the gain is attenuated.

According to the present invention, since the variable-gain amplifier has a voltage feedback path interconnecting a signal input section and a signal output section, changes caused in the drain current by production tolerances of the FETs are suppressed for stabilized circuit operation.

According to the present invention, since a plurality of first dual-gate FETs each including a first FET having a gate for being supplied with an input signal and a second FET connected in cascade to the first FET are connected parallel to each other, a plurality of second dual-gate FETs each including a third FET having a gate for being supplied with an inverted input signal and a fourth FET connected in cascade to the third FET are connected parallel to each other, and voltages can separately be applied to the gates of the second FETs and the gates of the fourth FETs, which are associated with each other, from corresponding voltage control means, the variable-gain amplifier made up of the first dual-gate FETs for amplifying the input signal and the variable-gain amplifier made up of the second dual-gate FETs for amplifying the inverted input signal have the same gain in a gain control range. Therefore, balanced signals can be input to and output from the variable-gain amplifiers for improving second-order distortions and canceling common mode noise.

The invention claimed is:

1. A variable-gain amplifier comprising:
a plurality of dual-gate FETs having first FETs having respective gates for being supplied with an input signal and second FETs having respective sources connected respectively to drains of the first FETs, the first FETs having respective sources connected in common to each other and the second FETs having respective drains connected in common to each other; and
a plurality of voltage control means connected to respective gates of the second FETs for applying gate voltages separately thereto, the plurality of voltage control means including at least a first voltage control means and a second voltage control means, the first voltage control means and the second voltage control means being responsive to a voltage source such that the minimum voltage source output at which the first voltage control means produces an output voltage is less than the minimum voltage source output at which the second voltage control means produces an output voltage.

2. A variable-gain amplifier comprising:
a plurality of variable-gain amplifying elements having FETs having respective gates for being supplied with an input signal and bipolar transistors having respective emitters connected respectively to drains of the FETs, the FETs having respective sources connected in common to each other and the bipolar transistors having respective collectors connected in common to each other; and
a plurality of voltage control means connected to respective bases of the bipolar transistors for applying base voltages separately thereto, the plurality of voltage control means including at least a first voltage control means and a second voltage control means, the first voltage control means and the second voltage control means being responsive to a voltage source such that the minimum voltage source output at which the first voltage control means produces an output voltage is less than the minimum voltage source output at which the second voltage control means produces an output voltage.

3. The variable-gain amplifier according to claim 1 or 2, wherein the FETs for being supplied with the input signal have substantially identical electric characteristics.

4. The variable-gain amplifier according to claim 1 or 2, wherein at least one of the FETs for being supplied with the input signal has electric characteristics different from electric characteristics of the other one or more of the FETs for being supplied with the input signal.

5. The variable-gain amplifier according to claim 1 or 2, further comprising a voltage feedback path interconnecting a signal input section and a signal output section.

6. A variable-gain amplifier comprising:
a plurality of first dual-gate FETs having first FETs having respective gates for being supplied with an input signal and second FETs having respective sources connected respectively to drains of the first FETs, the first FETs having respective sources connected in common to each other and the second FETs having respective drains connected in common to each other;

a plurality of second dual-gate FETs having third FETs having respective gates for being supplied with an inverted input signal and fourth FETs having respective sources connected respectively to drains of the third FETs, the third FETs having respective sources connected in common to each other and the fourth FETs having respective drains connected in common to each other; and a plurality of voltage control means connected to respective gates of the second FETs and respective gates of the fourth FETs for applying gate voltages separately thereto;

wherein the number of the first dual-gate FETs, the number of the second dual-gate FETs, and the number of the voltage control means are equal to each other, the plurality of voltage control means including at least a first voltage control means and a second voltage control means, the first voltage control means and the second voltage control means being responsive to a voltage source such that the minimum voltage source output at which the first voltage control means produces an output voltage is less than the minimum voltage source output at which the second voltage control means produces an output voltage.

7. A variable-gain amplifier comprising:

a plurality of dual-gate FETs having first FETs having respective gates for being supplied with an input signal such that the first FETs are supplied with the same input signal, and second FETs having respective sources connected respectively to drains of the first FETs, the first FETs having respective sources connected in common to each other and the second FETs having respective drains connected in common to each other;

a voltage feedback path coupling the drains of the second FETs to the gates of first FETs; and a plurality of voltage control means connected to respective gates of the second FETs for applying gate voltages separately thereto, the plurality of voltage control means including at least a first voltage control means and a second voltage control means, the first voltage control means and the second voltage control means being responsive to a voltage source such that the minimum voltage source output at which the first voltage control means produces an output voltage is less than the minimum voltage source output at which the second voltage control means produces an output voltage.

* * * * *

UNITED STATES PATENT AND TRADEMARK OFFICE
CERTIFICATE OF CORRECTION

| | |
|---|---|
| PATENT NO. | : 7,323,937 B2 |
| APPLICATION NO. | : 10/526758 |
| DATED | : January 29, 2008 |
| INVENTOR(S) | : Koichi Ooya and Tsuyoshi Sakuma |

It is certified that error appears in the above-identified patent and that said Letters Patent is hereby corrected as shown below:

Column 3, line 12, "IIP3are" should read --IIP3 are--;
Column 3, line 17, "IIP3are" should read --IIP3 are--;
Column 3, line 21, "IIP3when" should read --IIP3 when--;
Column 3, line 23, "IIP3when" should read --IIP3 when--;
Column 3, line 27, "IIP3characteristics" should read --IIP3 characteristics--;
Column 3, line 30, "IIP3characteristics" should read --IIP3 characteristics--;
Column 3, line 34, "IIP3when" should read --IIP3 when--;
Column 5, line 31, "makeup" should read --make up--;
Column 5, line 34, "makeup" should read --make up--;
Column 5, line 53, "IIP3characteristics" should read --IIP3 characteristics--;
Column 6, line 2, "IIP3characteristics" should read --IIP3 characteristics--;
Column 6, line 13, "IIIP3value" should read --IIIP3 value--;
Column 6, line 18, "IIP3characteristics" should read --IIP3 characteristics--;
Column 6, line 40, "IIP3characteristics" should read --IIP3 characteristics--;
Column 6, line 67, "IIP3when" should read --IIP3 when--;
Column 7, line 7, "IIP3degradations" should read --IIP3 degradations--;
Column 9, line 42, "IIP3can" should read --IIP3 can--;
Column 9, line 53, "IIP3can" should read --IIP3 can--;
Column 9, line 67, "IIP3of" should read --IIP3 of--;
Column 10, line 6, "invention, since at" should read --invention, at--;
Column 10, line 10, "IIP3can" should read --IIP3 can--;
Column 12, line 26, "of first" should read --of the first--.

Signed and Sealed this

Twenty-fourth Day of March, 2009

JOHN DOLL
*Acting Director of the United States Patent and Trademark Office*